(12) United States Patent
Hung

(10) Patent No.: US 8,183,638 B2
(45) Date of Patent: May 22, 2012

(54) DUAL TRIGGERED SILICON CONTROLLED RECTIFIER

(75) Inventor: Kei-Kang Hung, Changhua County (TW)

(73) Assignee: Raydium Semiconductor Corporation, Hsinchu County (TW)

( * ) Notice: Subject to any disclaimer, the term of this patent is extended or adjusted under 35 U.S.C. 154(b) by 199 days.

(21) Appl. No.: 12/796,666

(22) Filed: Jun. 8, 2010

(65) Prior Publication Data

US 2010/0244094 A1    Sep. 30, 2010

Related U.S. Application Data

(62) Division of application No. 12/146,456, filed on Jun. 26, 2008, now Pat. No. 7,777,277.

(30) Foreign Application Priority Data

Jan. 24, 2008  (TW) .............................. 97102622 A

(51) Int. Cl.
    *H01L 23/62* (2006.01)
(52) U.S. Cl. . 257/360; 257/173; 257/355; 257/E29.001; 257/E29.013
(58) Field of Classification Search ................. 257/173, 257/355, 360, E29.001, E29.013
    See application file for complete search history.

(56) References Cited

U.S. PATENT DOCUMENTS

| | | | |
|---|---|---|---|
| 4,382,225 | A | 5/1983 | Peltz |
| 4,455,472 | A | 6/1984 | Moss |
| 4,554,607 | A | 11/1985 | Mora |
| 4,605,872 | A | 8/1986 | Rung |
| 4,691,197 | A | 9/1987 | Damiano et al. |
| 5,942,714 | A | 8/1999 | Oberlin et al. |
| 6,215,135 | B1 | 4/2001 | Schröder |
| 6,690,557 | B2 | 2/2004 | Hung |
| 6,768,619 | B2 | 7/2004 | Ker |
| 6,872,987 | B2 | 3/2005 | Yu |
| 2003/0146474 | A1 | 8/2003 | Ker |

*Primary Examiner* — Nathan W. Ha
*Assistant Examiner* — Yu-Hsi Sun

(57) ABSTRACT

A dual triggered silicon controlled rectifier (DTSCR) comprises: a semiconductor substrate; a well region, a first N+ diffusion region, a first P+ diffusion region, a second N+ diffusion region, a second P+ diffusion region, a third P+ diffusion region, positioned in one side of the DTSCR and across the well region and semiconductor substrate; a third N+ diffusion region, positioned in another side of the DTSCR and across the well region and the semiconductor substrate; a first gate, positioned above the semiconductor substrate between the first P+ diffusion region and the third P+ diffusion region, utilized as a P-type trigger node to receive a first trigger current or a first trigger voltage; and a second gate, positioned above the well region between the second N+ diffusion region and the third N+ diffusion region, utilized as an N-type trigger node to receive a second trigger current or a second trigger voltage.

4 Claims, 8 Drawing Sheets

DUAL TRIGGERED SILICON CONTROLLED RECTIFIER

CROSS REFERENCE TO RELATED APPLICATIONS

This divisional application claims the benefit of U.S. patent application Ser. No. 12/146,456, filed on Jun. 26, 2008 and included herein by reference.

BACKGROUND OF THE INVENTION

1. Field of the Invention

The present invention relates to a dual triggered silicon controlled rectifier (DTSCR), and more particularly, to a DTSCR that can be applied to a trim-fuse circuit.

2. Description of the Prior Art

Please refer to FIG. 1. FIG. 1 shows a simplified diagram of a conventional trim-fuse circuit 100 using a MOS transistor having large size as a switch element. As shown in FIG. 1, the conventional trim-fuse circuit 100 comprises a MOS transistor 110 and a fuse 120, wherein the MOS transistor 110 is utilized for receiving a control signal Sc to control whether to let a trim current pass through the MOS transistor 110. However, if the conventional trim-fuse circuit 100 is utilized in a low voltage level process, then the conventional trim-fuse circuit 100 will not be able to work under high voltage level. This is because the conventional trim-fuse circuit 100 often requires a voltage at high voltage level to provide a sufficient trim current. But the low voltage level device element is not able to work under high voltage level.

SUMMARY OF THE INVENTION

It is therefore one of the objectives of the present invention to provide a dual triggered silicon controlled rectifier (DTSCR) that can be applied to a trim-fuse circuit, so as to solve the above problems.

In accordance with an embodiment of the present invention, a dual triggered silicon controlled rectifier (DTSCR) is disclosed. The DTSCR comprises: a semiconductor substrate; a well region, positioned in the semiconductor substrate; a first N+ diffusion region and a first P+diffusion region, positioned in the semiconductor substrate, for use as a first electrode of the DTSCR; a second N+ diffusion region and a second P+ diffusion region, positioned in the well region, for use as a second electrode of the DTSCR; a third P+ diffusion region, positioned in one side of the DTSCR and across the well region and the semiconductor substrate; a third N+ diffusion region, positioned in another side of the DTSCR and across the well region and the semiconductor substrate; a first gate, positioned above the semiconductor substrate between the first P+ diffusion region and the third P+ diffusion region, for use as a P-type trigger node to receive a first trigger current or a first trigger voltage; and a second gate, positioned above the well region between the second N+ diffusion region and the third N+ diffusion region, for use as an N-type trigger node to receive a second trigger current or a second trigger voltage.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and the claims to refer to particular system components. As one skilled in the art will appreciate, manufacturers may refer to a component by different names. This document does not intend to distinguish between components that differ in name but not function. In the following discussion and in the claims, the terms "include", "including", "comprise", and "comprising" are used in an open-ended fashion, and thus should be interpreted to mean "including, but not limited to . . . " The terms "couple" and "coupled" are intended to mean either an indirect or a direct electrical connection. Thus, if a first device couples to a second device, that connection may be through a direct electrical connection, or through an indirect electrical connection via other devices and connections.

The present invention relates to a dual triggered silicon controlled rectifier (DTSCR), and this document will illustrate several exemplary embodiments that apply the DTSCR to a trim-fuse circuit in the present invention. However, a person of average skill in the pertinent art should be able to understand that the present invention can be applied for various types of circuit schemes and is not limited to the particular embodiments described in the following paragraphs or to the particular manner in which any features of such embodiments are implemented.

Figure 1:
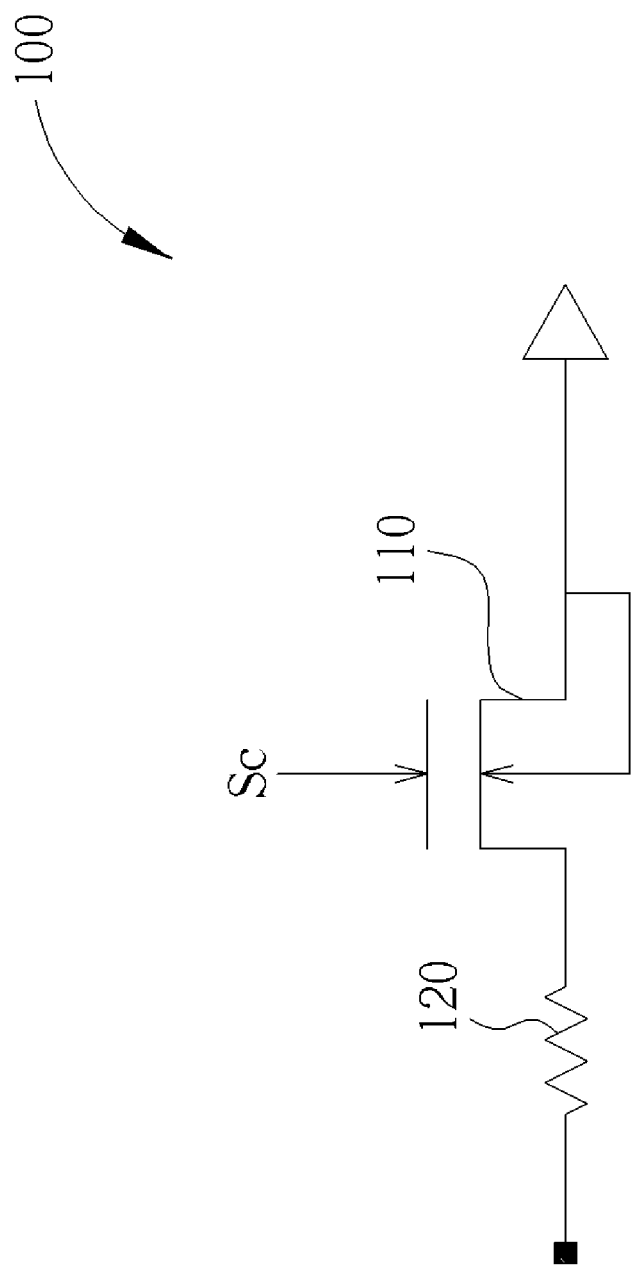
FIG. 1 shows a simplified diagram of a conventional trim-fuse circuit using a MOS transistor having large size as a switch element.
Figure 2:
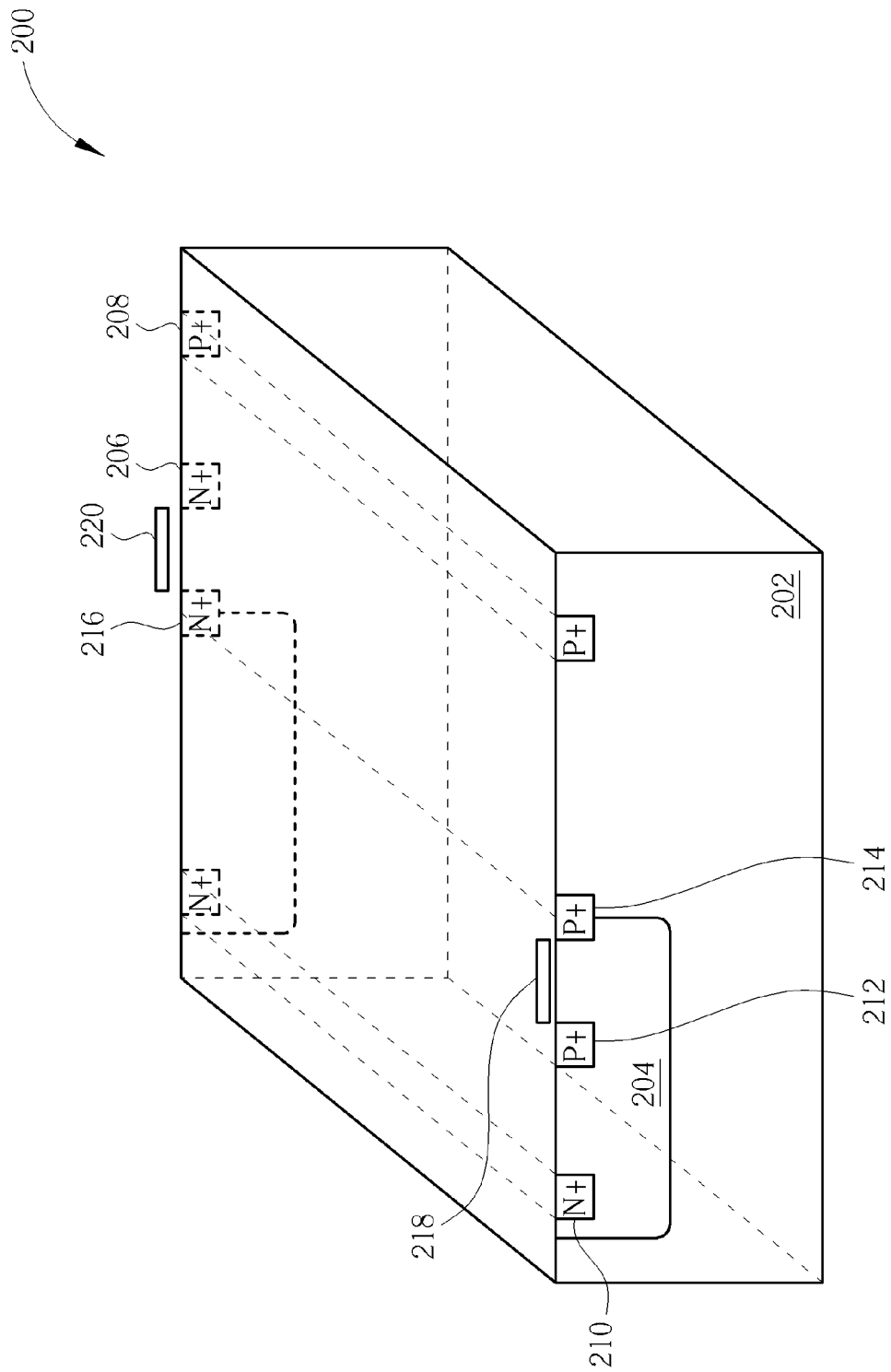
FIG. 2 shows a simplified three-dimensional diagram of a DTSCR in accordance with a first embodiment of the present invention.

Please refer to FIG. 2. FIG. 2 shows a simplified three-dimensional diagram of a DTSCR 200 in accordance with a first embodiment of the present invention. As shown in FIG. 2, the DTSCR 200 comprises: a P-type semiconductor substrate 202; a N-well 204, positioned in the P-type semiconductor substrate 202; a first N+ diffusion region 206 and a first P+ diffusion region 208, positioned in the P-type semiconductor substrate 202, for use as a cathode of the DTSCR 200; a second N+ diffusion region 210 and a second P+ diffusion region 212, positioned in the N-well 204, for use as an anode of the DTSCR 200; a third P+ diffusion region 214, positioned in one side of the DTSCR 200 and across the N-well 204 and the P-type semiconductor substrate 202; a third N+ diffusion region 216, positioned in another side of the DTSCR 200 and across the N-well 204 and the P-type semiconductor substrate 202; a first gate 218, positioned above the N-well 204 between the second P+diffusion region 212 and the third P+ diffusion region 214, for use as a P-type trigger node of the DTSCR 200 to receive a first trigger current or a first trigger voltage; and a second gate 220, positioned above the P-type semiconductor substrate 202 between the first N+ diffusion region 206 and the third N+ diffusion region 216, for use as an N-type trigger node of the DTSCR 200 to receive a second trigger current or a second trigger voltage.

Figure 3:
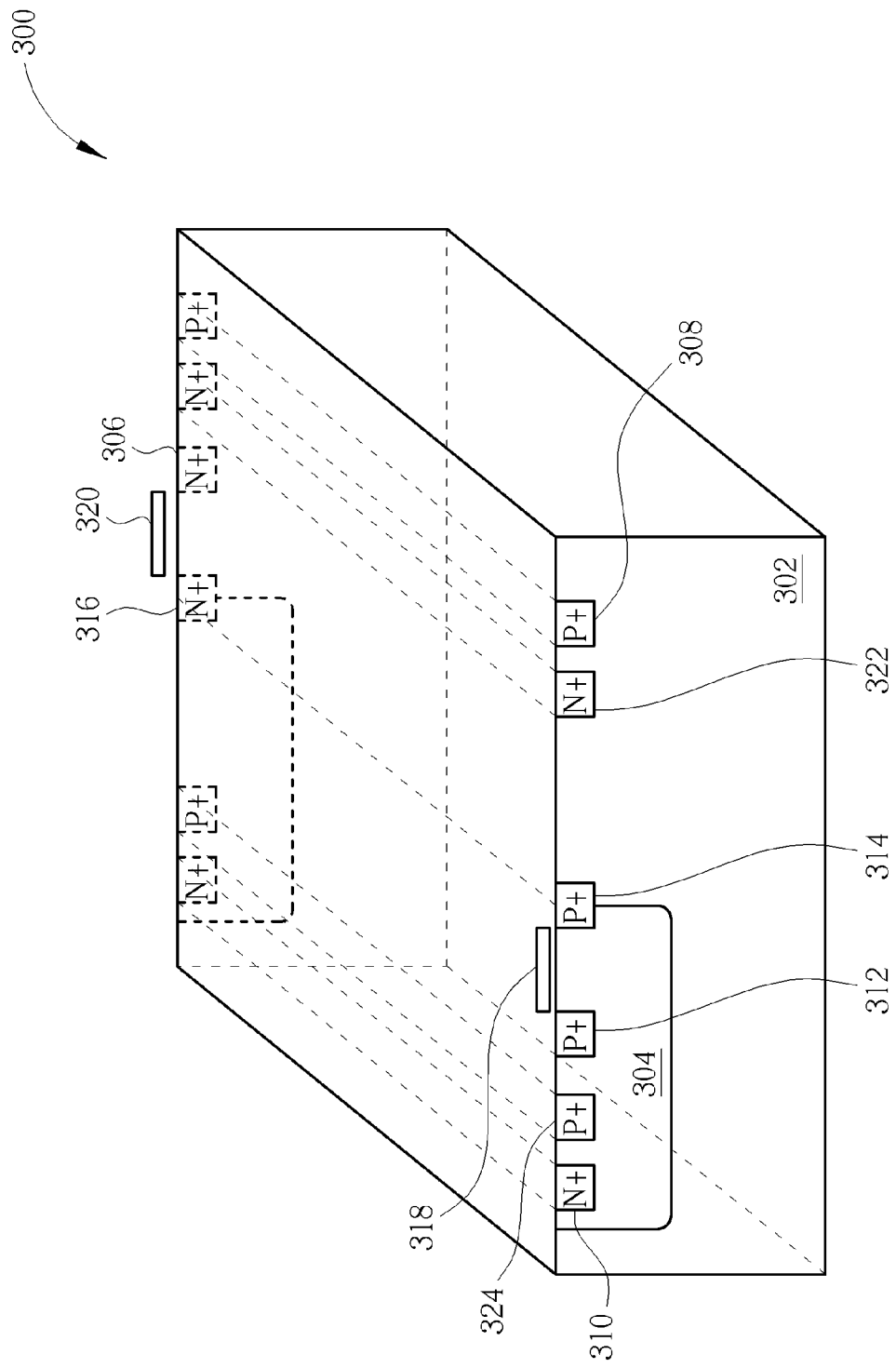
FIG. 3 shows a simplified three-dimensional diagram of a DTSCR in accordance with a second embodiment of the present invention.

Please refer to FIG. 3. FIG. 3 shows a simplified three-dimensional diagram of a DTSCR 300 in accordance with a second embodiment of the present invention. As shown in FIG. 3, the DTSCR 300 comprises: a P-type semiconductor substrate 302; a N-well 304, positioned in the P-type semiconductor substrate 302; a first N+ diffusion region 306, a first P+ diffusion region 308, and a fourth N+ diffusion region 322, positioned in the P-type semiconductor substrate 302, for use as a cathode of the DTSCR 300; a second N+ diffusion region 310, a second P+ diffusion region 312, and a fourth P+ diffusion region 324, positioned in the N-well 304, for use as an anode of the DTSCR 300; a third P+diffusion region 314, positioned in one side of the DTSCR 300 and across the N-well 304 and the P-type semiconductor substrate 302; a third N+ diffusion region 316, positioned in another side of the DTSCR 300 and across the N-well 304 and the P-type semiconductor substrate 302; a first gate 318, positioned above the N-well 304 between the second P+ diffusion region 312 and the third P+ diffusion region 314, for use as a P-type trigger node of the DTSCR 300 to receive a first trigger current or a first trigger voltage; and a second gate 320, positioned above the P-type semiconductor substrate 302 between the first N+ diffusion region 306 and the third N+ diffusion region 316, for use as an N-type trigger node of the DTSCR 300 to receive a second trigger current or a second trigger voltage.

Figure 4:
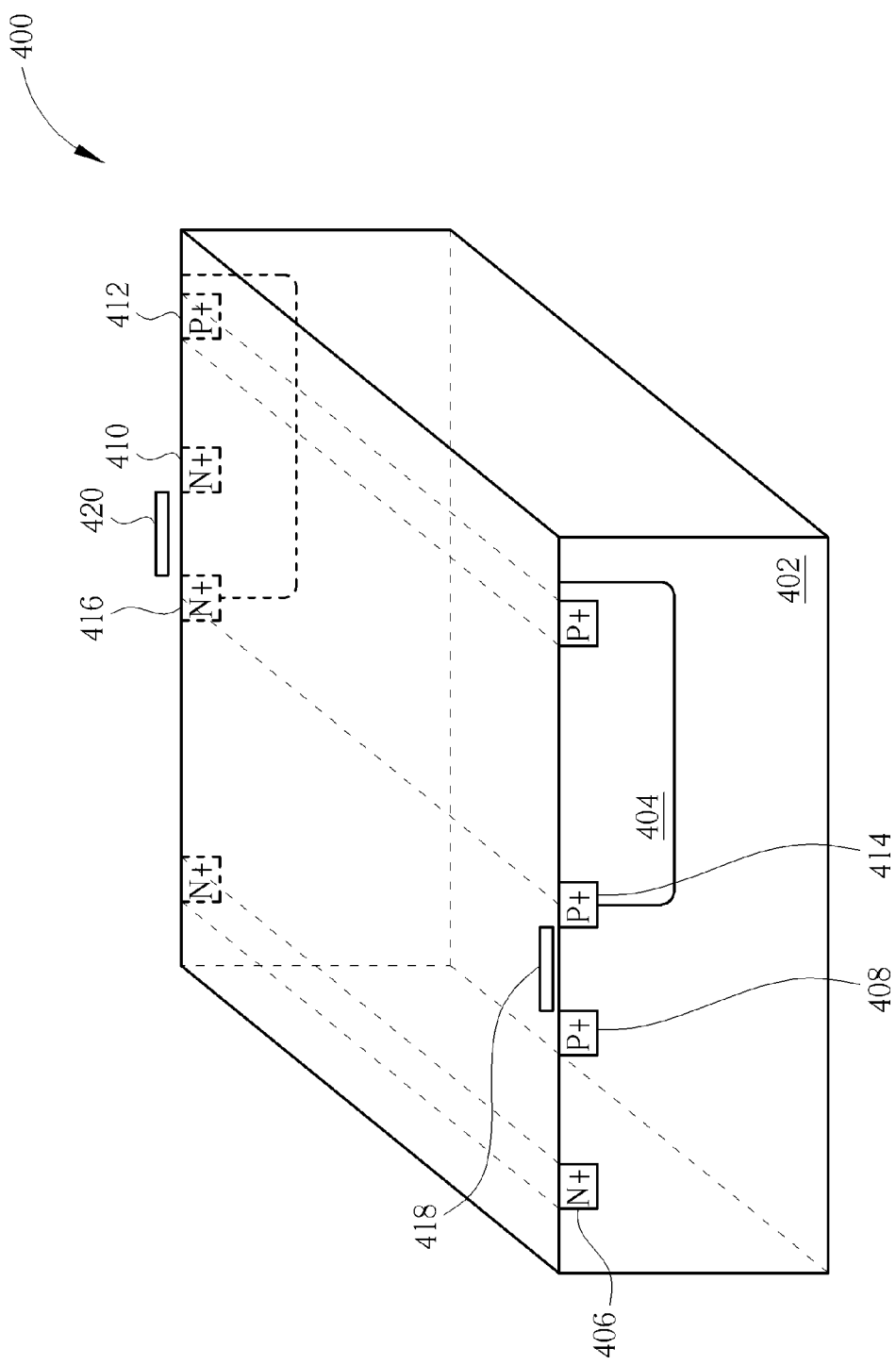
FIG. 4 shows a simplified three-dimensional diagram of a DTSCR in accordance with a third embodiment of the present invention.

Please refer to FIG. 4. FIG. 4 shows a simplified three-dimensional diagram of a DTSCR 200 in accordance with a third embodiment of the present invention. As shown in FIG. 4, the DTSCR 400 comprises: a N-type semiconductor substrate 402; a P-well 404, positioned in the N-type semiconductor substrate 402; a first N+ diffusion region 406 and a first P+ diffusion region 408, positioned in the N-type semiconductor substrate 402, for use as an anode of the DTSCR 400; a second N+ diffusion region 410 and a second P+ diffusion region 412, positioned in the P-well 404, for use as a cathode of the DTSCR 400; a third P+ diffusion region 414, positioned in one side of the DTSCR 400 and across the P-well 404 and the N-type semiconductor substrate 402; a third N+ diffusion region 416, positioned in another side of the DTSCR 400 and across the P-well 404 and the N-type semiconductor substrate 402; a first gate 418, positioned above the N-type semiconductor substrate 402 between the first P+ diffusion region 408 and the third P+ diffusion region 414, for use as a P-type trigger node of the DTSCR 400 to receive a first trigger current or a first trigger voltage; and a second gate 420, positioned above the P-well 404 between the second N+ diffusion region 410 and the third N+ diffusion region 416, for use as an N-type trigger node of the DTSCR 400 to receive a second trigger current or a second trigger voltage.

Figure 5:
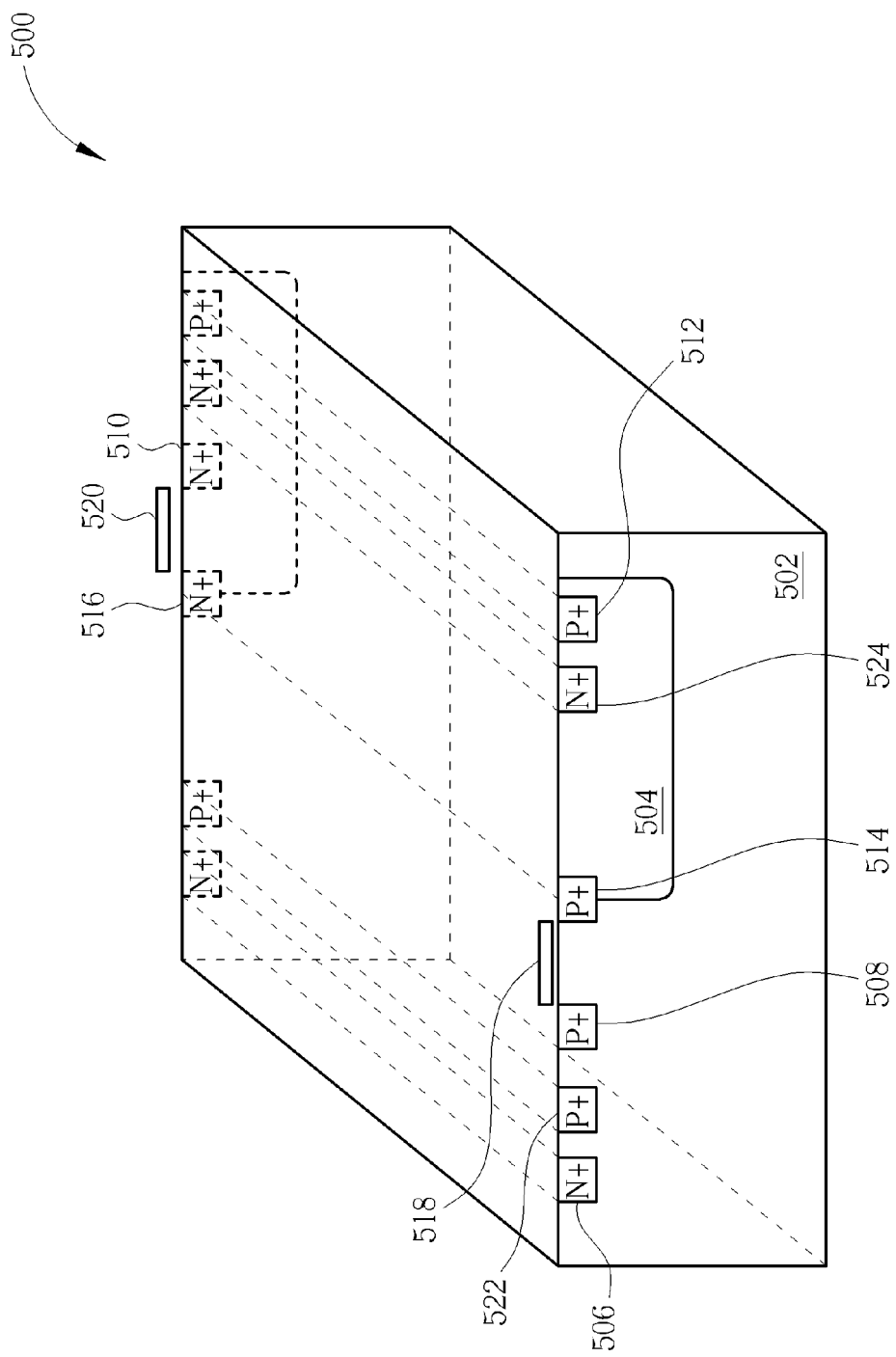
FIG. 5 shows a simplified three-dimensional diagram of a DTSCR in accordance with a fourth embodiment of the present invention.

Please refer to FIG. 5. FIG. 5 shows a simplified three-dimensional diagram of a DTSCR 500 in accordance with a fourth embodiment of the present invention. As shown in FIG. 5, the DTSCR 500 comprises: a N-type semiconductor substrate 502; a P-well 504, positioned in the N-type semiconductor substrate 502; a first N+ diffusion region 506, a first P+ diffusion region 508, and a fourth P+ diffusion region 522, positioned in the N-type semiconductor substrate 502, for use as an anode of the DTSCR 500; a second N+ diffusion region 510 and a second P+ diffusion region 512, and a fourth N+ diffusion region 524, positioned in the P-well 504, for use as a cathode of the DTSCR 500; a third P+diffusion region 514, positioned in one side of the DTSCR 500 and across the P-well 504 and the N-type semiconductor substrate 502; a third N+ diffusion region 516, positioned in another side of the DTSCR 500 and across the P-well 504 and the N-type semiconductor substrate 502; a first gate 518, positioned above the N-type semiconductor substrate 502 between the first P+ diffusion region 508 and the third P+diffusion region 514, for use as a P-type trigger node of the DTSCR 500 to receive a first trigger current or a first trigger voltage; and a second gate 520, positioned above the P-well 504 between the second N+ diffusion region 510 and the third N+ diffusion region 516, for use as an N-type trigger node of the DTSCR 500 to receive a second trigger current or a second trigger voltage.

Figure 6:
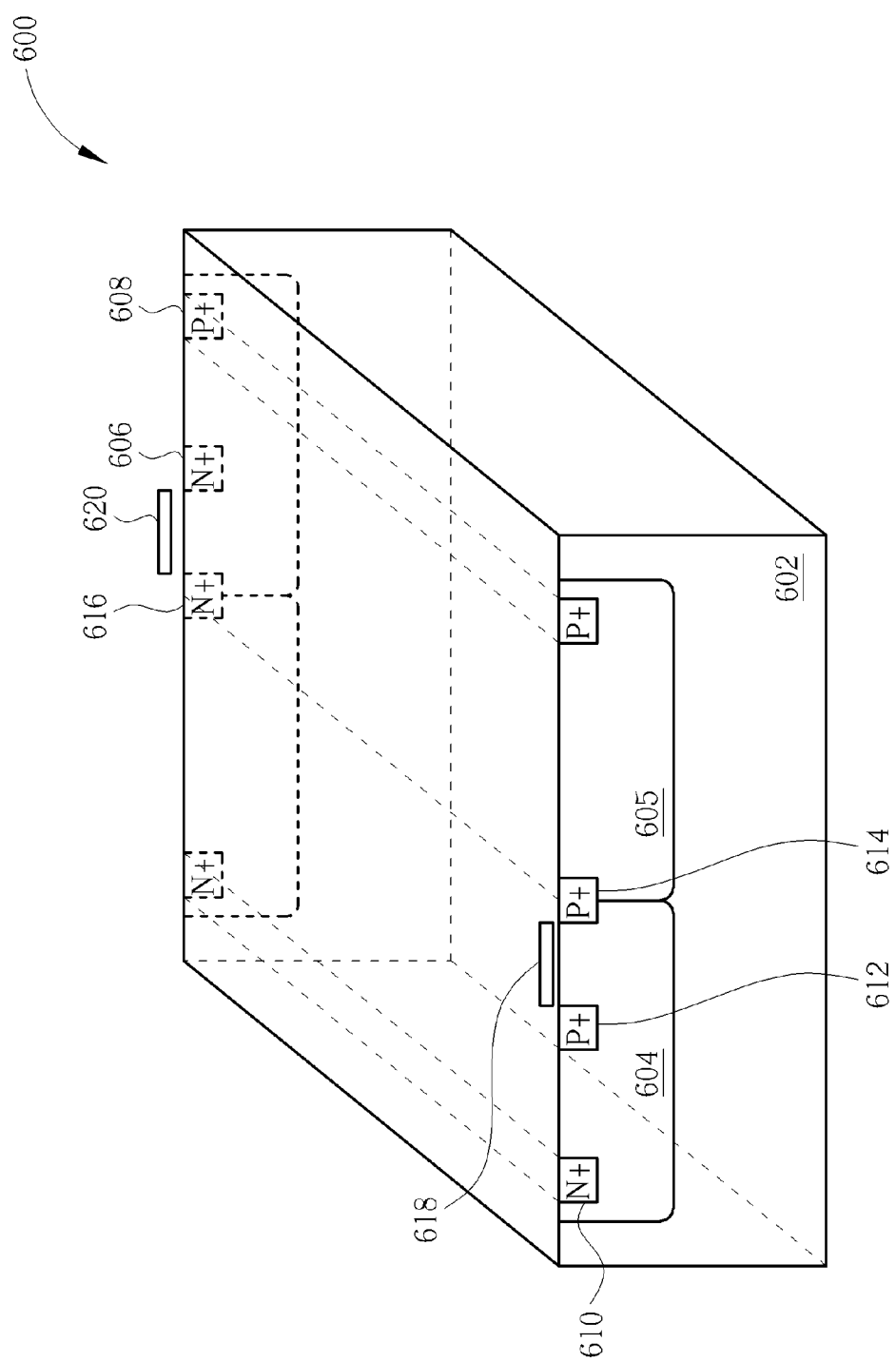
FIG. 6 shows a simplified three-dimensional diagram of a DTSCR in accordance with a fifth embodiment of the present invention.

Please refer to FIG. 6. FIG. 6 shows a simplified three-dimensional diagram of a DTSCR 600 in accordance with a fifth embodiment of the present invention. As shown in FIG. 6, the DTSCR 600 comprises: a P-type semiconductor substrate 602; an N-well 604, positioned in the P-type semiconductor substrate 602; a P-well 605, positioned in the P-type semiconductor substrate 602 and adjacent to the N-well 604; a first N+ diffusion region 606 and a first P+ diffusion region 608, positioned in the P-well 605, for use as a cathode of the DTSCR 600; a second N+ diffusion region 610 and a second P+ diffusion region 612, positioned in the N-well 604, for use as an anode of the DTSCR 600; a third P+ diffusion region 614, positioned in one side of the DTSCR 600 and across the N-well 604 and the P-well 605; a third N+ diffusion region 616, positioned in another side of the DTSCR 600 and across the N-well 604 and the P-well 605; a first gate 618, positioned above the N-well 604 between the second P+ diffusion region 612 and the third P+ diffusion region 614, for use as a P-type trigger node of the DTSCR 600 to receive a first trigger current or a first trigger voltage; and a second gate 620, positioned above the P-well 605 between the first N+ diffusion region 606 and the third N+ diffusion region 616, for use as an N-type trigger node of the DTSCR 600 to receive a second trigger current or a second trigger voltage. Please note that the above embodiment is only for an illustrative purpose and is not meant to be a limitation of the present invention. For example, the P-type semiconductor substrate 602 also can be replaced by a N-type semiconductor substrate.

Figure 7:
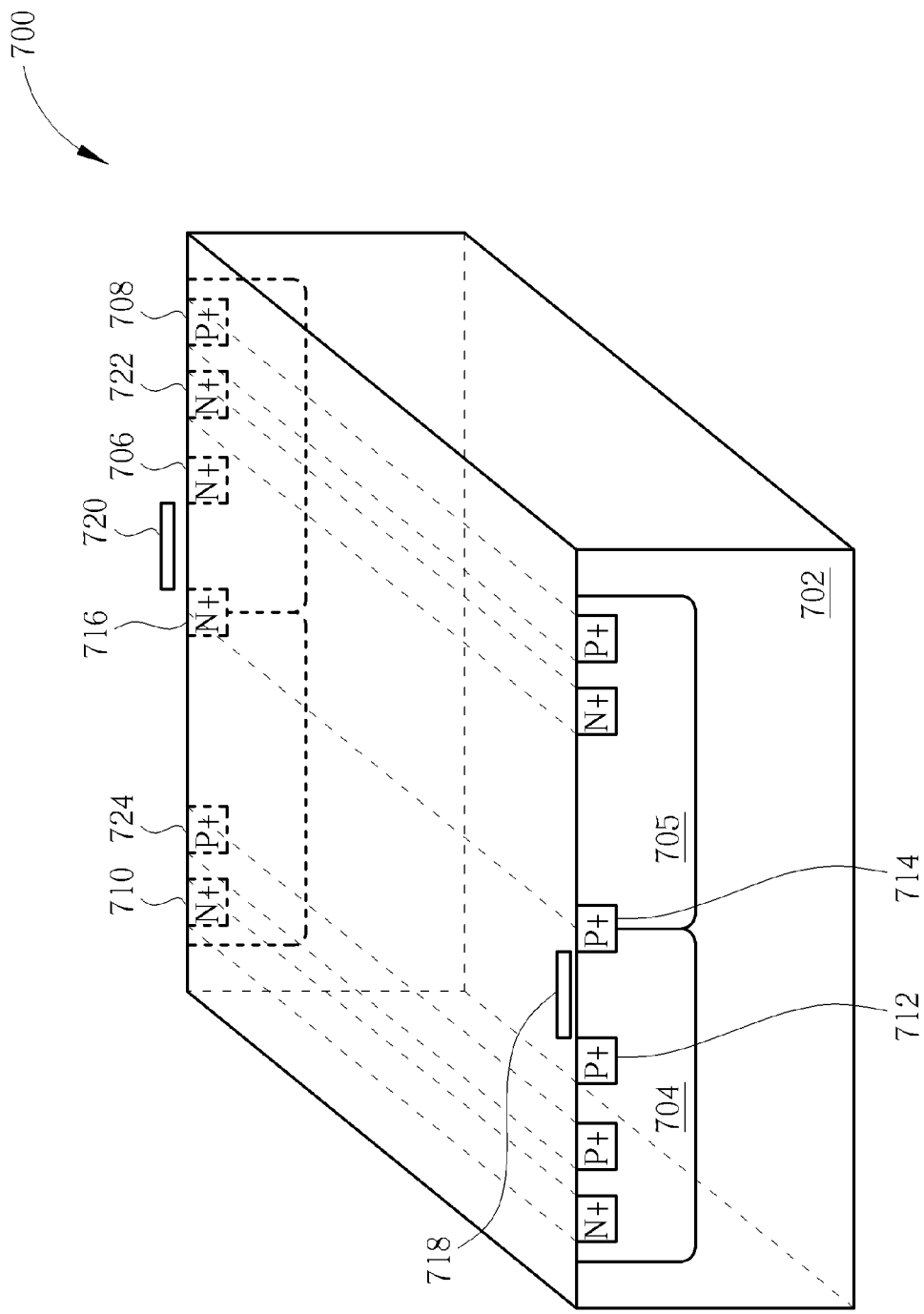
FIG. 7 shows a simplified three-dimensional diagram of a DTSCR in accordance with a sixth embodiment of the present invention.

Please refer to FIG. 7. FIG. 7 shows a simplified three-dimensional diagram of a DTSCR 700 in accordance with a sixth embodiment of the present invention. As shown in FIG. 7, the DTSCR 700 comprises: a P-type semiconductor substrate 702; an N-well 704, positioned in the P-type semiconductor substrate 702; a P-well 705, positioned in the P-type semiconductor substrate 702 and adjacent to the N-well 704; a first N+ diffusion region 706, a first P+ diffusion region 708, and a fourth N+ diffusion region 722, positioned in the P-well 705, for use as a cathode of the DTSCR 700; a second N+ diffusion region 710, a second P+ diffusion region 712, and a fourth P+ diffusion region 724, positioned in the N-well 704, for use as an anode of the DTSCR 700; a third P+ diffusion region 714, positioned in one side of the DTSCR 700 and across the N-well 704 and the P-well 705; a third N+ diffusion region 716, positioned in another side of the DTSCR 700 and across the N-well 704 and the P-well 705; a first gate 718, positioned above the N-well 704 between the second P+ diffusion region 712 and the third P+diffusion region 714, for use as a P-type trigger node of the DTSCR 700 to receive a first trigger current or a first trigger voltage; and a second gate 720, positioned above the P-well 705 between the first N+ diffusion region 706 and the third N+ diffusion region 716, for use as an N-type trigger node of the DTSCR 700 to receive a second trigger current or a second trigger voltage. Please note that the above embodiment is only for an illustrative purpose and is not meant to be a limitation of the present invention. For example, the P-type semiconductor substrate 702 also can be replaced by a N-type semiconductor substrate.

Figure 8:
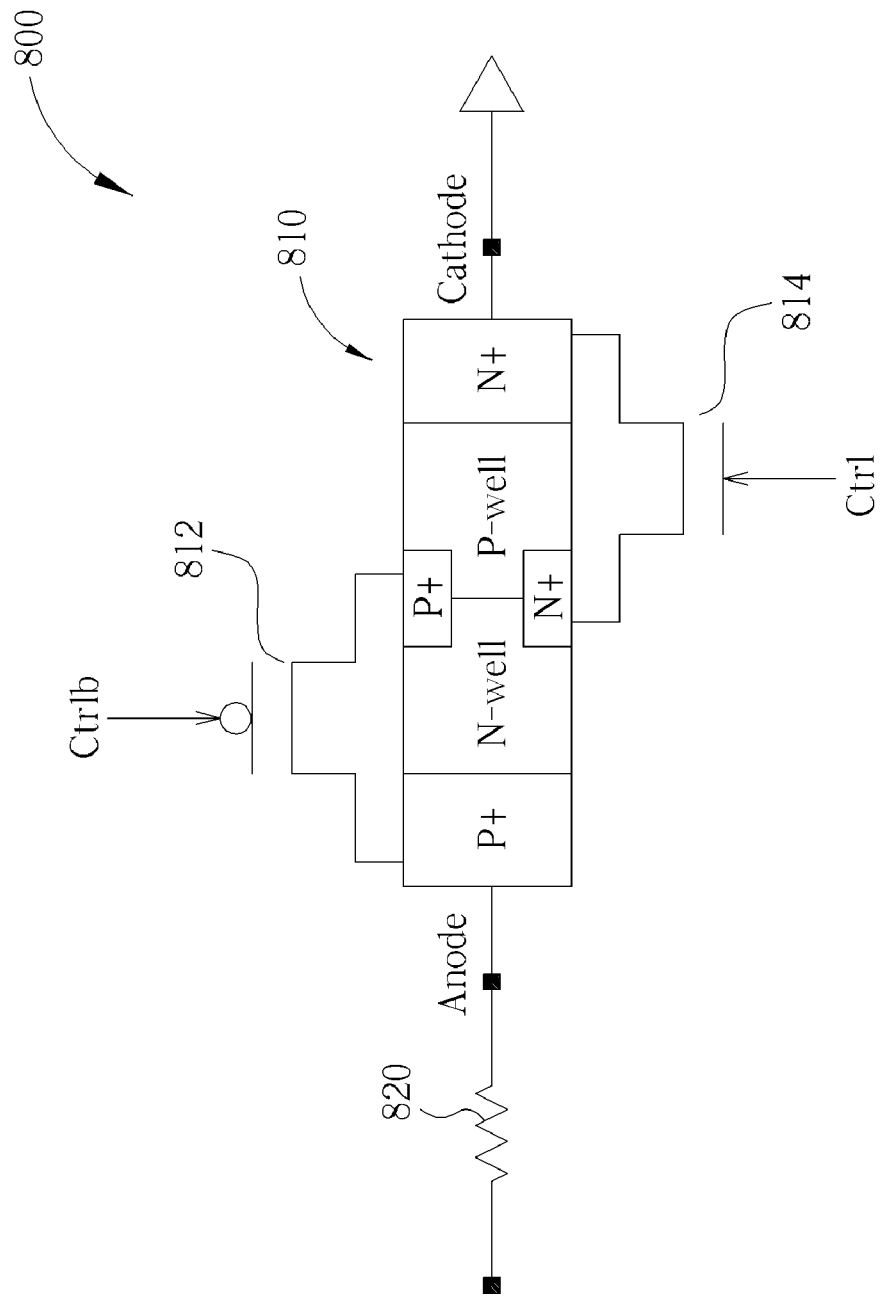
FIG. 8 shows a simplified diagram of a trim-fuse circuit using a DTSCR of the present invention as a switch element.

Please refer to FIG. 8. FIG. 8 shows a simplified diagram of a trim-fuse circuit 800 using a DTSCR of the present invention as a switch element. As shown in FIG. 8, the trim-fuse circuit 800 comprises a DTSCR 810 and a fuse 820, wherein there are a PMOS transistor 812 and a NMOS transistor 814 formed in the DTSCR 810. The PMOS transistor 812 and the NMOS transistor 814 are respectively utilized for receiving a first control signal Ctrlb (such as a first trigger current or a first trigger voltage) and a second control signal Ctrl (such as a second trigger current or a second trigger voltage) to control whether to conduct the DTSCR 810 so as to let a trim current pass through the DTSCR 810. In addition, please note that the first control signal Ctrlb and the second control signal Ctrl both have low voltage level. Since the DTSCR disclosed in every embodiment of the present invention can work under high voltage level, the problems in the prior art can be solved. In addition, since the DTSCR disclosed in every embodiment of the present invention have extremely good I-V curve characteristics, the DTSCR can perform the switching operation for determining whether conduct or not faster under a condition of providing the same trigger current or the same first trigger voltage.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A dual triggered silicon controlled rectifier (DTSCR) comprising:
    a semiconductor substrate;
    a well region, positioned in the semiconductor substrate;
    a first N+ diffusion region and a first P+ diffusion region, positioned in the semiconductor substrate, for use as a first electrode of the DTSCR;
    a second N+ diffusion region and a second P+ diffusion region, positioned in the well region, for use as a second electrode of the DTSCR;
    a third P+ diffusion region, positioned in one side of the DTSCR and in direct contact with both the well region and the semiconductor substrate;
    a third N+ diffusion region, positioned in another side of the DTSCR and in direct contact with both the well region and the semiconductor substrate;
    a first gate, positioned above the semiconductor substrate between the first P+ diffusion region and the third P+ diffusion region, for use as a P-type trigger node to receive a first trigger current or a first trigger voltage; and
    a second gate, positioned above the well region between the second N+ diffusion region and the third N+ diffusion region, for use as an N-type trigger node to receive a second trigger current or a second trigger voltage;
    wherein the third P+ diffusion region and the third N+ diffusion region are positioned across from each other and spaced apart in a direction of a gate width of the first gate.

2. The DTSCR of claim 1, wherein the semiconductor substrate is a N-type semiconductor substrate, the well region is a P-well, the first electrode is an anode, the second electrode is a cathode.

3. The DTSCR of claim 2, further comprising:
    a fourth P+ diffusion region, positioned in the N-type semiconductor substrate, for use as the anode of the DTSCR; and
    a fourth N+ diffusion region, positioned in the P-well, for use as the cathode of the DTSCR.

4. The DTSCR of claim 1, applied to a trim-fuse circuit.

* * * * *